United States Patent
Qu

(10) Patent No.: US 11,309,179 B2
(45) Date of Patent: Apr. 19, 2022

(54) METHOD FOR PROCESSING PRODUCT LAYER

(71) Applicants: Semiconductor Manufacturing International (Shanghai) Corporation, Shanghai (CN); Semiconductor Manufacturing International (Beijing) Corporation, Beijing (CN)

(72) Inventor: Hui Qu, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/924,976

(22) Filed: Jul. 9, 2020

(65) Prior Publication Data

US 2021/0013030 A1 Jan. 14, 2021

(30) Foreign Application Priority Data

Jul. 10, 2019 (CN) .......................... 201910619393.7

(51) Int. Cl.
  *H01L 21/311* (2006.01)
  *H01L 21/02* (2006.01)
  *H01L 21/67* (2006.01)

(52) U.S. Cl.
  CPC .. *H01L 21/02057* (2013.01); *H01L 21/02126* (2013.01); *H01L 21/02334* (2013.01); *H01L 21/67063* (2013.01)

(58) Field of Classification Search
  CPC ................................................. H01L 21/31116
  See application file for complete search history.

(56) References Cited

U.S. PATENT DOCUMENTS

| | | | | |
|---|---|---|---|---|
| 2004/0007257 A1* | 1/2004 | Park | ................... | H01L 21/67051 134/95.2 |
| 2005/0227888 A1* | 10/2005 | Verhaverbeke | .......... | C11D 7/06 510/175 |
| 2018/0358232 A1* | 12/2018 | Bi | ......................... | H01L 29/785 |
| 2020/0161297 A1* | 5/2020 | Chen | ................... | H01L 21/3065 |

* cited by examiner

*Primary Examiner* — Thomas T Pham
(74) *Attorney, Agent, or Firm* — Anova Law Group, PLLC

(57) ABSTRACT

A method for processing a product layer includes providing a dielectric layer over a substrate, etching to remove a portion of the dielectric layer, forming a product layer over the etched dielectric layer, and removing the product layer by providing a dissolving solution and using the dissolving solution to rinse or soak the product layer to dissolve the product layer.

18 Claims, 3 Drawing Sheets

METHOD FOR PROCESSING PRODUCT LAYER

CROSS-REFERENCE TO RELATED APPLICATION

This application claims priority to Chinese Patent Application No. 201910619393.7, filed on Jul. 10, 2019, the entire content of which is incorporated herein by reference.

TECHNICAL FIELD

The present disclosure generally relates to the technical field of semiconductor manufacturing and, in particular, to a method for processing a product layer.

BACKGROUND

Silicon oxide plays an important role in a semiconductor manufacturing process. For example, silicon oxide is often used as a selective diffusion mask, since the diffusion rate of dopants, such as boron, phosphorus, arsenic, or antimony, in silicon oxide is much slower than that in silicon. In addition, silicon oxide may be grown from silicon, which provides good adhesion between silicon oxide and the underlying silicon surface, in addition to providing good electrical insulation and chemical stability. Therefore, silicon oxide is widely used in the field of semiconductor manufacturing.

During the semiconductor manufacturing process, silicon oxide needs to be etched to meet a target thickness for a process requirement. During an etching process, silicon oxide may be removed by chemical reactions between the gas molecules and silicon oxide. Chemical products may thus adhere to the surface of the remaining silicon oxide. The products need to be cleaned after the etching process, so as to make the silicon oxide surface meet a cleaning requirement, which ensures subsequent processes to be performed smoothly.

However, the existing methods for processing the product layer still need to be improved.

SUMMARY

Embodiments and implementations of the present disclosure provide a method for processing a product layer, in order to effectively remove the product layer.

One aspect of the present disclosure provides a method for processing a product layer. The method includes providing a dielectric layer over a substrate, etching to remove a portion of the dielectric layer, forming a product layer over the etched dielectric layer, and removing the product layer by providing a dissolving solution and using the dissolving solution to rinse or soak the product layer to dissolve the product layer.

Optionally, the dissolving solution includes a mixed solution containing aqueous ammonia ($NH_3$) and hydrogen peroxide ($H_2O_2$).

Optionally, a molar ratio of the ammonia in water solvent is 0.1% to 2%, a molar ration of the hydrogen peroxide in the water solvent is 0.2% to 5%.

Optionally, the dissolving solution is aqueous ammonia.

Optionally, a molar ratio of the ammonia in water solvent is 0.1% to 2%.

Optionally, the dissolving solution includes a carbonic acid solution.

Optionally, a concentration of the carbonic acid solution is 0.01 to 0.04 mol/L.

Optionally, a duration for rinsing or soaking the product layer in the dissolving solution is 40 seconds~120 seconds.

Optionally, a material of the dielectric layer includes silicon oxide.

Optionally, a dry etching process is used to remove the portion of the dielectric layer.

Optionally, a processing gas used in the dry etching process includes hydrogen fluoride (HF) and ammonia ($NH_3$).

Optionally, the processing gas used in the dry etching process further includes nitrogen and/or argon.

Optionally, a flow rate of nitrogen is 400 sccm~1500 sccm when the nitrogen is further included in the processing gas.

Optionally, a chamber pressure of the dry etching process is 20 mTorr~2000 mTorr.

Optionally, after removing the product layer, the method further includes providing a cleaning solution, and using the cleaning solution to rinse or soak the dielectric layer.

Optionally, the cleaning solution includes isopropyl alcohol or acetone.

Optionally, the method further includes rinsing or soaking the dielectric layer by using the cleaning solution for 15 seconds~40 seconds.

Compared to the existing technology, the technical solutions of the present disclosure have the following advantages.

For example, when using the provided dissolving solution to rinse and soak the product layer, the product layer, the substrate, and the dielectric layer have different solubilities in the dissolving solution. The product layer is dissolvable in the dissolving solution, but the substrate is hardly dissolvable or indissolvable in the dissolving solution, and the dielectric layer is hardly dissolvable or indissolvable in the dissolving solution. Thus, the product layer on the top of the dielectric layer can be removed. By dissolving the product layer in the dissolving solution to remove the product layer, the removal efficiency is increased, the repeated processes of removing a portion of the dielectric layer and removing the product layer are eliminated, and the processing time is reduced.

DETAILED DESCRIPTION

A method for processing a product layer is provided and analyzed in combination with following embodiments. For example, one of the methods for processing the product layer includes providing a dielectric layer over a substrate, etching to remove a portion of the dielectric layer, forming a product layer over the etched dielectric layer, sublimating the product layer to remove the product layer, and repeatedly performing processes of etching to remove a portion of the dielectric layer and sublimating the product layer until the thickness of the dielectric layer reaches a preset value.

On one hand, during the process of removing the product layer by sublimating the product layer (referred to as "Post Heat Treatment" (PHT) process), a temperature of a chamber needs to be maintained at 80° C. to 120° C. by a temperature regulator. On the other hand, when etching to remove a portion of the dielectric layer and forming a small amount of the product layer, the PHT process, e.g., sublimating the product layer, needs to be performed. As such, the process of etching to remove the portion of the dielectric layer and the PHT process needs to be repeated multiple times. As such, the processes of removing the product layer are complicated with low efficiency.

To make the objectives, technical solutions, and advantages clearer, the present disclosure is further described in detail below in connection with accompanying drawings and embodiments.

Figure 3:
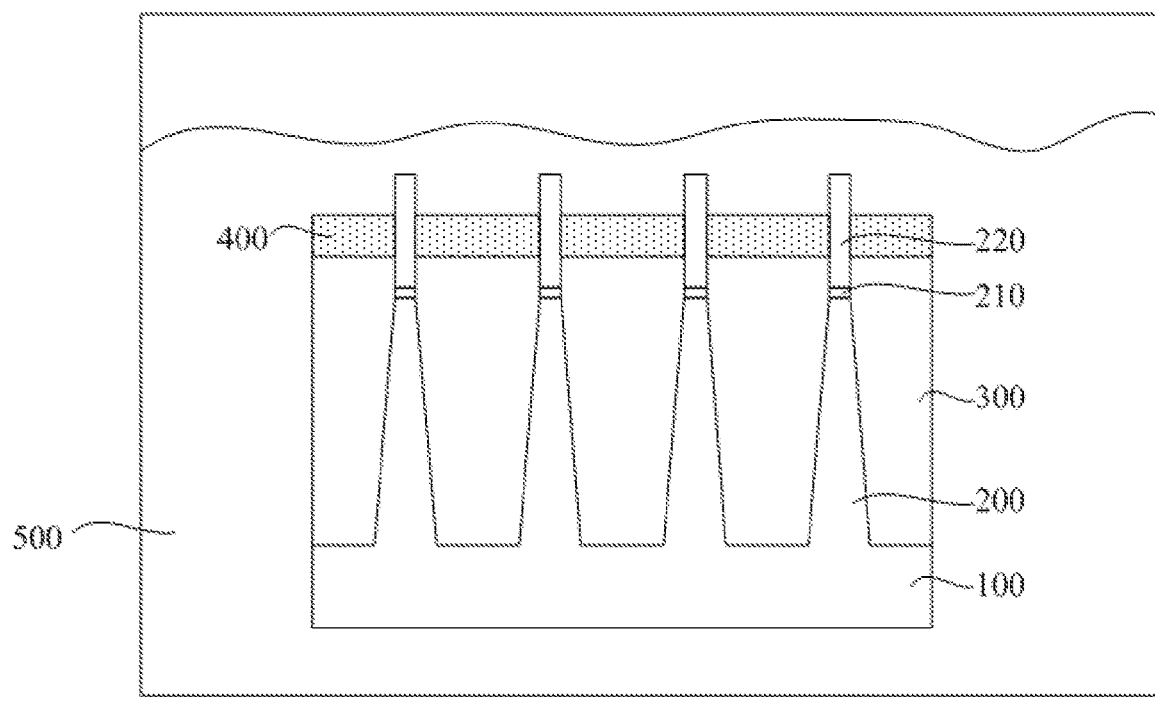
Figure 4:
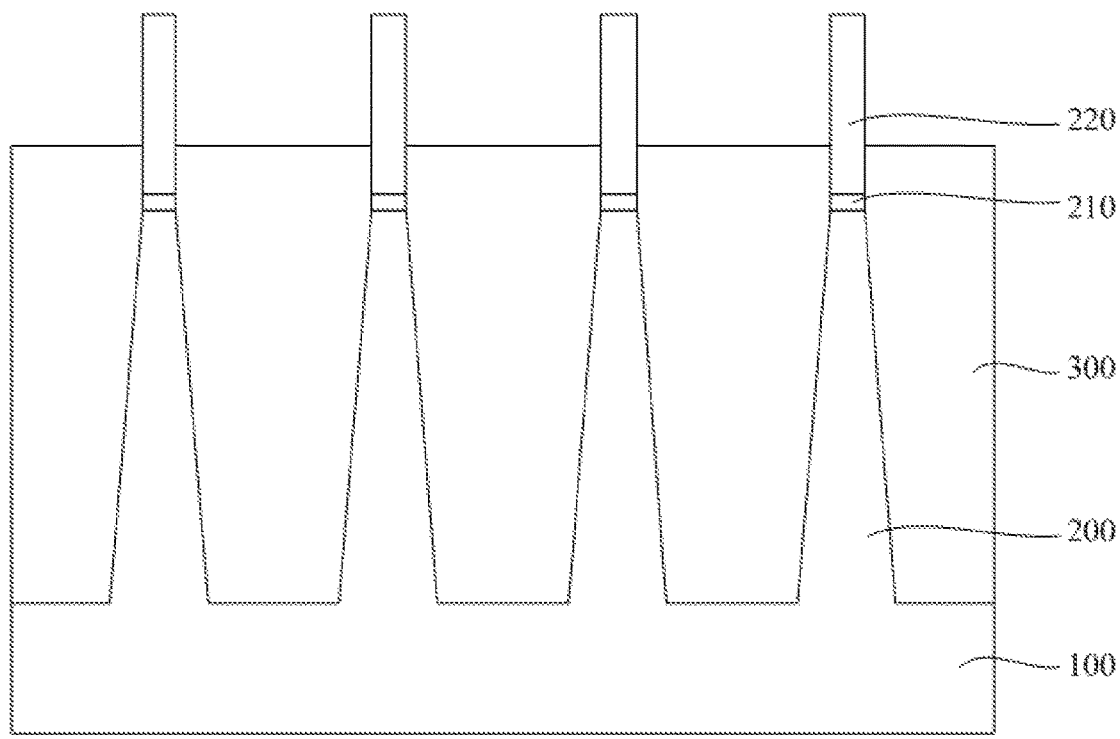
Figure 5:
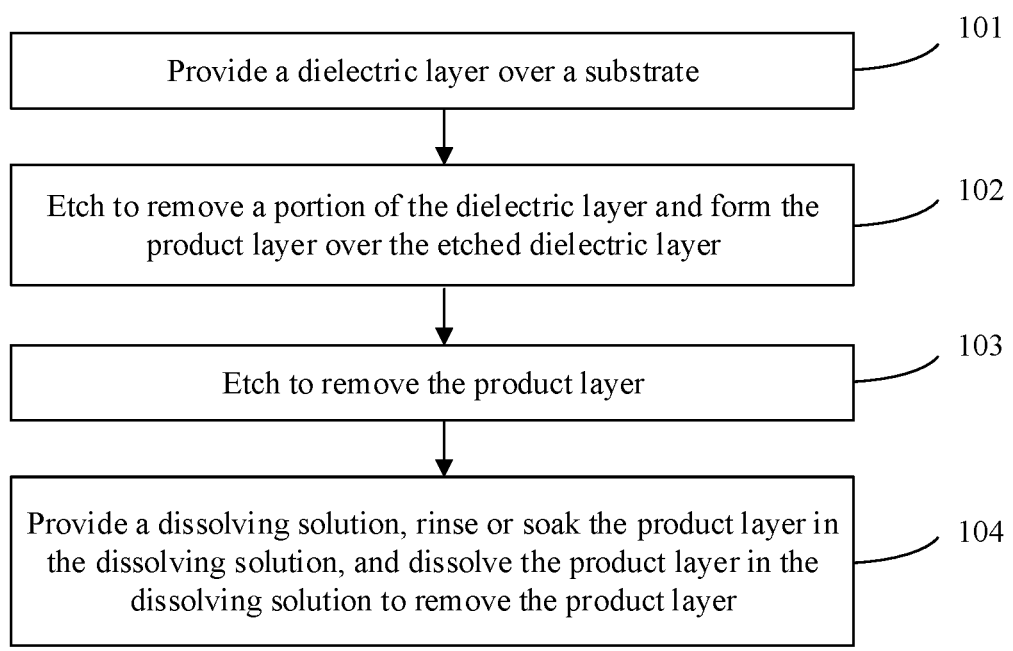
FIG. 5 illustrates a flowchart of an exemplary method for forming a semiconductor device according to some embodiments of the present disclosure.

FIG. 1 to FIG. 4 illustrate schematic structures of an exemplary semiconductor device at certain stages during a method of processing a product layer according to an embodiment of the present disclosure. FIG. 5 illustrates a flowchart of an exemplary method for forming a semiconductor device according to some embodiments in the present disclosure.

Figure 1:
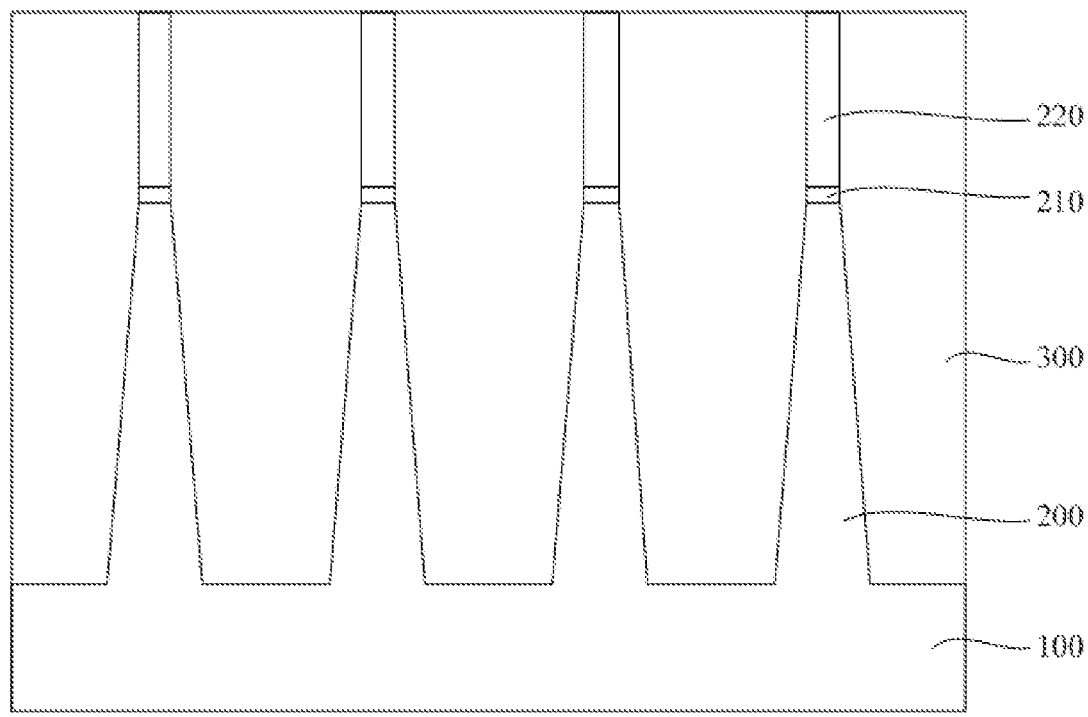
FIG. 1 to FIG. 4 illustrate schematic structures of an exemplary semiconductor device at certain stages during a method of processing a product layer according to some embodiments of the present disclosure.

Referring to FIG. 5, in 101, the method includes providing a dielectric layer over a substrate. FIG. 1 illustrates a corresponding structure.

In FIG. 1, a substrate 100 is provided. A dielectric layer 300 is formed over the substrate 100.

The material of the substrate 100 includes silicon, germanium, silicon germanium, silicon carbide, gallium arsenide, indium gallium, or a combination thereof. In some embodiments, the substrate 100 includes silicon.

In some embodiments, the material of the dielectric layer 300 includes silicon oxide.

In some embodiments, the substrate 100 further includes a plurality of fins 200 protruding from the substrate 100. The dielectric layer 300 covers the sidewalls of the fins 200. In some embodiments, only the dielectric layer 300 is formed over the substrate 100.

In some embodiments, the material of the fins 200 includes silicon. In other embodiments, the material of the fins 200 may include germanium, silicon germanium, silicon carbide, gallium arsenide, indium gallium, or a combination thereof.

In some embodiments, multiple fins 200 are arranged over the substrate 100 with equal intervals. In other embodiments, a spacing between any two adjacent fins may not be equal.

In some embodiments, forming the substrate 100 and fins 200 include: providing an initial substrate (not shown), forming a patterned fin mask dielectric layer (not shown) on the surface of the initial substrate, etching the initial substrate by using the fin mask dielectric layer as a mask. The etched initial substrate is used as the substrate 100. Protrusions on the surface of the substrate 100 are used as fins 200.

In some embodiments, tops of the fins 200 are covered by a hard mask layer 220. The top of the dielectric layer 300 is coplanar with the top of the hard mask layer 220.

The hard mask layer 220 can protect the tops of the fins 200. The hard mask layer 220 can prevent the top surfaces of the fins 200 from being damaged when a portion of the dielectric layer 300 is subsequently removed by etching.

The material of the hard mask layer 220 includes silicon nitride, silicon oxynitride, silicon carbide, silicon carbonitride, silicon oxynitride, or a combination thereof. In one embodiment, the material of the hard mask layer 220 includes silicon nitride.

In some embodiments, an isolation layer 210 is located between the top of the fin 200 and the hard mask layer 220. The isolation layer 210 covers the top surfaces of the fins 200, and the hard mask layer 220 covers the top surface of the isolation layer 210. In some embodiments, the hard mask layer may also cover the top surfaces of the fins 200 directly.

The isolation layer 210 can prevent atomic dislocation between the hard mask layer 220 and the top surfaces of the fins 200, which improves the bonding strength between the hard mask layer 220 and the fins 200.

In some embodiments, the material of the isolation layer 210 includes silicon oxide. In other embodiments, the material of the isolation layer 210 may include germanium oxide.

In some embodiments, forming the isolation layer 210, the hard mask layer 220, and the dielectric layer 300 includes the following processes. A first isolation film (not shown) is formed over the substrate 100. The first isolation film covers the tops of the fins 200. A first through-hole (not shown) is formed in the first isolation film by etching the first isolation film. The top surfaces of the fins 200 are exposed through the bottom of the first through-hole. The isolation layer 210 is formed to fill the first through-hole. A second isolation film (not shown) is formed on the top of the first isolation film and isolation layer 210. A second through-hole (not shown) is formed in the second isolation film by etching the second isolation film. The top surface of the isolation layer 210 is exposed through the bottom of the second through-hole. The hard mask layer 220 is formed to fill the second through-hole. The first isolation film and the second isolation film are used as the isolation layer 210.

Figure 2:
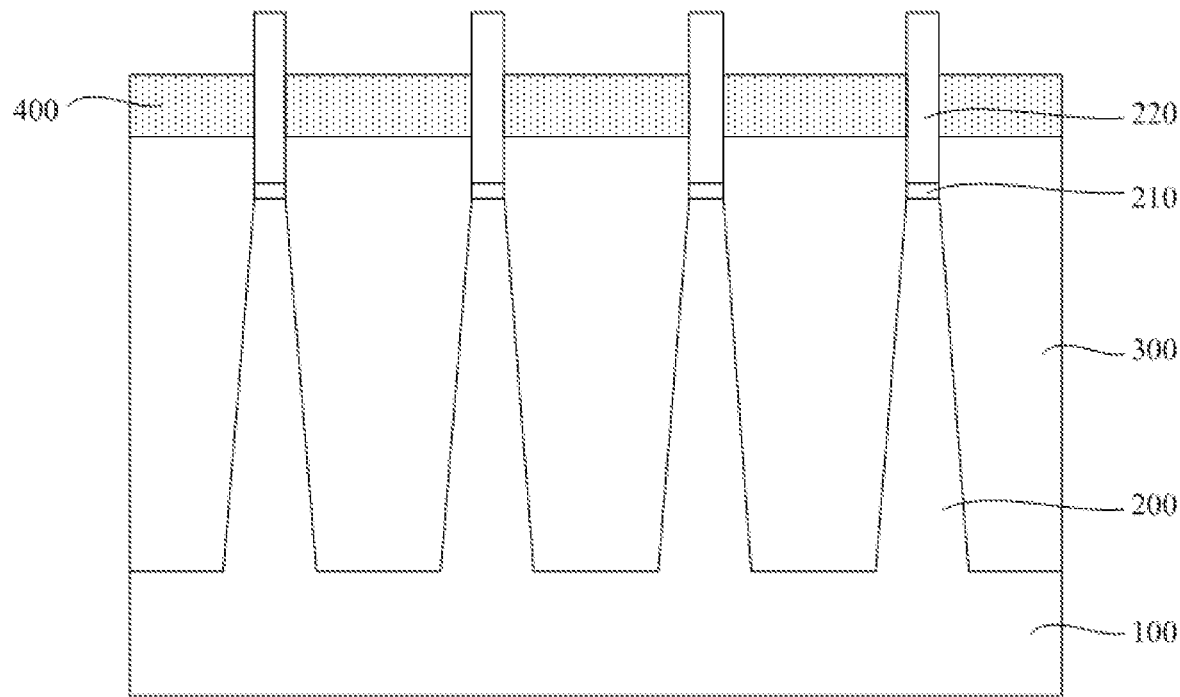

Referring to FIG. 5, in 102, the method includes etching to remove a portion of the dielectric layer and forming the product layer over the etched dielectric layer. In 103, the method further includes etching to remove the product layer. FIG. 2 illustrates a corresponding structure.

Referring to FIG. 2, a portion of the dielectric layer 300 is removed by etching, and a product layer 400 is formed over the dielectric layer 300.

In some embodiments, removing a portion of the dielectric layer 300 includes a dry etching process. In some embodiments, removing a portion of the dielectric layer 300 may include a wet etching process. In some embodiments, removing a portion of the dielectric layer 300 may include a chemical mechanical polish (CMP) process.

In some embodiments, the processing gas used in the dry etching process includes hydrogen fluoride and ammonia. Hydrogen fluoride and ammonia chemically react with the dielectric layer 300 to produce ammonium fluorosilicate and water. The chemical reaction formula is as follows:

$$SiO_2 + 6HF + 2NH_3 \rightarrow (NH_4)_2SiF_6 + 2H_2O\uparrow.$$

The ammonium fluorosilicate is deposited on the surface of the remaining dielectric layer 300 to form a product layer 400. Water, as another product of the chemical reaction, may be gasified, e.g., by evaporation.

During the dry etching process, if the pressure of the chamber is too high, in one aspect, the silicon substrate 100 is easy to react with the oxygen in the chamber to form silicon oxide, which may reduce the thickness of the substrate 100. In another aspect, the gasification temperature of the produced water is related to the pressure of the chamber. If the pressure of the chamber is too high, the gasification temperature of the water may increase. Therefore, the chamber temperature needs to be maintained at a high temperature, which can easily promote the oxidation reaction of the silicon substrate 100. If the pressure of the chamber is too low, the low pressure may cause the slow heat transfer within the chamber, which affects the etching rate of the dielectric layer 300. In some embodiments, the pressure of the chamber used during the reaction is 20 mTorr~2000 mTorr.

In a certain embodiment, the pressure of the chamber used during the reaction is 1800 mTorr.

If the process temperature of the dry etching process is too high, the silicon substrate 100 is prone to the oxidation reaction, which affects the formation quality of the silicon substrate 100. If the process temperature of the dry etching process is too low, the reaction rate of hydrogen fluoride, ammonia, and the dielectric layer 300 is slow, and the reaction is even difficult to trigger. In some embodiments, the chamber temperature during the dry etching process ranges from 70° C. to 90° C., for example, from about 70° C. to 75° C.

In a certain embodiment, the chamber temperature during the dry etching process is 75° C.

In some embodiments, the processing gas used in the dry etching process further includes nitrogen and/or argon. In some embodiments, during the dry etching process, nitrogen gas is continuously introduced into the chamber.

For example, by continuously introducing nitrogen gas into the chamber, a flow of the nitrogen is generated in the chamber. The flowing nitrogen may flush the dielectric layer. A portion of the product layer 400 may be blown away from the surface of the dielectric layer 300 by the flowing nitrogen. The product layer 400 blown away from the surface of the dielectric layer 300 is carried out of the chamber by the flowing nitrogen. As such, the product layer 400 adhered over the dielectric layer 300 is reduced.

If the flow rate of the nitrogen is too low, the flowing of nitrogen in the chamber is slow, which results a poor nitrogen flushing effect. Thus, it is difficult to blow away the portion of the product layer 400 from the surface of the dielectric layer 300. If the flow rate of the nitrogen is too high, the pressure of the chamber may experience a sudden increase and a sudden decrease, which affects the gasification of the by-product water. In some embodiments, the flow rate of the nitrogen used for the reaction is 400 sccm~1500 sccm.

The pressure of the nitrogen is 0.1 mTorr 1 mTorr. In some embodiments, the pressure of the nitrogen used for the reaction is 0.2 mTorr.

In one embodiment, the dry etching process is performed until the remaining dielectric layer 300 reaches a preset value.

Referring to FIG. 5, in 104, the method includes providing a dissolving solution, rinsing or soaking the product layer in the dissolving solution, and dissolving the product layer in the dissolving solution to remove the product layer. FIG. 3 and FIG. 4 illustrate corresponding structures.

Referring to FIG. 3 and FIG. 4, a dissolving solution 500 is provided. The product layer 400 is rinsed and soaked by using the dissolving solution 500. The product layer 400 is removed by being dissolved in the dissolving solution 500.

The solubility of the product layer 400 in the dissolving solution 500 is much higher than that of the substrate 100 and the dielectric layer 300. The product layer 400 is dissolvable in the dissolving solution 500. The substrate 100 is hardly dissolvable or indissolvable in the dissolving solution 500. The dielectric layer 300 is hardly dissolvable or indissolvable in the dissolving solution 500. Due to different solubilities, the product layer 400 over the dielectric layer 300 may be removed with the dissolving solution 500.

By removing the product layer 400 from the dielectric layer 300 using the dissolving solution 500, in one aspect, all of the product layer 400 over the dielectric layer 300 may be removed at once without having to repeat the processes of etching to remove a portion of the dielectric layer 300 and sublimating the product layer 400. In another aspect, the process of dissolving the product layer 400 at the low temperature may even be performed at room temperature. In consideration of both aspects, the processes of the method are simplified, which can improve the efficiency of removing the product layer 400.

In some embodiments, the product layer 400 is soaked in the dissolving solution 500.

In some embodiments, the components soaked in the dissolving solution 500 further includes the fin 200, the isolation layer 210, and the hard mask layer 220. The fin 200, the isolation layer 210, and the hard mask layer 220 are all hardly dissolvable or indissolvable in the dissolving solution 500.

In some embodiments, the process of soaking the substrate 100, the dielectric layer 300, and the product layer 400 and the dry etching process may be performed in different chambers. In other embodiments, after the dry etching process, the process of soaking the substrate 100, the dielectric layer 300, and the product layer 400 may be performed to remove the product layer in a same chamber.

In some other embodiments, the product layer may also be rinsed by the dissolving solution 500. The rinsing process may efficiently remove the product layer and make the surface of the dielectric layer cleaner.

In some embodiments, the dissolving solution 500 includes a mixed solution containing aqueous ammonia and hydrogen peroxide. If the solute concentration in the dissolving solution 500 is too low, the dissolution rate of the product layer 400 may be too slow, which may affect the processing efficiency of the product layer 400. In some embodiments, a molar ratio of the ammonia in water solvent is 0.1% to 2% and/or a molar ratio of the hydrogen peroxide in water solvent is 0.2% to 5%. In a certain embodiment, a molar ratio of ammonia ($NH_3$), hydrogen peroxide ($H_2O_2$), and water ($H_2O$) in the dissolving solution 500 is 1:2:100.

In some other embodiments, the dissolving solution includes aqueous ammonia, for example, without using hydrogen peroxide. The molar ratio of the ammonia in water solvent is 0.1% to 2%. In a certain embodiment, the molar ratio of ammonia ($NH_3$) and water ($H_2O$) in the dissolving solution 500 is 1:100.

In other embodiments, the dissolving solution is a carbonic acid solution. A concentration of the carbonic acid solution is 0.01 to 0.04 mol/L. In a certain embodiment, the concentration of the carbonic acid solution is 0.033 mol/L.

If the duration for rinsing or soaking is too short, the product layer 400 is difficult to be sufficiently dissolved in the dissolving solution 500, which results in a remaining product layer 400 over the dielectric layer 300. After all of the product layer 400 is dissolved in the dissolving solution 500, and if the substrate 100, and the dielectric layer 300 are still rinsed or soaked, the processing time may be unnecessarily extended. In some embodiments, the duration for rinsing or soaking the product layer 400 in the dissolving solution 500 ranges from 40 seconds to 120 seconds, for example, from about 40 seconds to 90 seconds, or from about 60 seconds to 120 seconds.

In a certain embodiment, the duration for soaking the product layer 400 in the dissolving solution 500 is 60 seconds.

The dissolving rate of the product layer 400 is related to the temperature of the dissolving solution 500. If the temperature of the dissolving solution 500 is too low, the dissolving rate of the product layer 400 may be too slow, which causes the processing time too long. If the temperature of the dissolving solution 500 is too high, the substrate 100 is prone to the oxidation reaction, which results in a silicon oxide film layer formed over the substrate 100 and may affect the formation quality of the substrate 100. In some embodiments, the temperature of the dissolving solution 500 ranges from 20° C. to 25° C.

In some embodiments, after removing the product layer 400, the process also includes providing a cleaning solution. The cleaning solution is used to rinse or soak the dielectric layer 300.

The cleaning solution may be able to remove the dielectric layer 300 and the dissolving solution 500 remaining on the surface of the substrate 100.

The cleaning solution is a volatile solution. In some embodiments, the cleaning solution includes isopropyl alcohol. In some other embodiments, the cleaning solution includes acetone.

The duration for rinsing or soaking the dielectric layer 300 in the cleaning solution is 15 seconds~40 seconds. In a certain embodiment, the duration for rinsing or soaking the dielectric layer 300 in isopropyl alcohol is 15 seconds.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for processing a product layer, comprising:
   providing a dielectric layer over a substrate, wherein the substrate includes a plurality of fins on a base substrate, a hard mask layer is formed on the plurality of fins, an isolation layer is formed between the hard mask layer and the plurality of fins to improve bonding strength between the hard mask layer and the plurality of fins, and the dielectric layer has a top surface coplanar with a top surface of the hard mask layer;
   etching, by a drying etching process, to remove a portion of the dielectric layer and forming a product layer by depositing a product from the drying etching process over the etched dielectric layer, wherein a top surface of the product layer is lower than the top surface of the hard mask layer and higher than a top surface of the isolation layer; and
   removing the product layer by providing a dissolving solution and using the dissolving solution to rinse or soak the product layer to dissolve the product layer.

2. The method according to claim 1, wherein the dissolving solution includes a mixed solution containing aqueous ammonia ($NH_3$) and hydrogen peroxide ($H_2O_2$).

3. The method according to claim 2, wherein a molar ratio of the ammonia in water solvent is 0.1% to 2% and a molar ratio of the hydrogen peroxide in the water solvent is 0.2% to 5%.

4. The method according to claim 1, wherein the dissolving solution is aqueous ammonia.

5. The method according to claim 4, wherein a molar ratio of the ammonia in water solvent is 0.1% to 2%.

6. The method according to claim 1, wherein the dissolving solution includes a carbonic acid solution.

7. The method according to claim 6, wherein a concentration of the carbonic acid solution is 0.01 mol/L to 0.04 mol/L.

8. The method according to claim 1, wherein a duration for rinsing or soaking the product layer in the dissolving solution is 40 seconds 120 seconds.

9. The method according to claim 1, wherein a material of the dielectric layer includes silicon oxide.

10. The method according to claim 1, wherein a processing gas used in the dry etching process includes hydrogen fluoride (HF) and ammonia ($NH_3$).

11. The method according to claim 10, wherein the processing gas used in the dry etching process further includes nitrogen or argon.

12. The method according to claim 11, wherein a flow rate of the nitrogen is 400 sccm 1500 sccm, when the nitrogen is further included in the processing gas.

13. The method according to claim 1, wherein a chamber pressure of the dry etching process is 20 mTorr-2000 mTorr.

14. The method according to claim 1, wherein after removing the product layer, the method further includes providing a cleaning solution, and using the cleaning solution to rinse or soak the dielectric layer.

15. The method according to claim 14, wherein the cleaning solution includes isopropyl alcohol or acetone.

16. The method according to claim 14, further including rinsing or soaking the dielectric layer by using the cleaning solution for 15 seconds-40 seconds.

17. The method according to claim 1, wherein a material of the product layer includes ammonium fluorosilicate.

18. The method according to claim 1, wherein after removing the product layer, a remaining portion of the dielectric layer has a top surface higher than the top surface of the isolation layer.

* * * * *